(12) United States Patent
Chuang et al.

(10) Patent No.: US 8,072,063 B2
(45) Date of Patent: Dec. 6, 2011

(54) LED LAMP MODULE AND FABRICATION METHOD THEREOF

(75) Inventors: Bill Chuang, Toucheng Township, Yilan County (TW); Chi Chih Lin, Pingjhen (TW)

(73) Assignee: Light Ocean Technology Corp., Bade, Taoyuan County (TW)

( * ) Notice: Subject to any disclaimer, the term of this patent is extended or adjusted under 35 U.S.C. 154(b) by 162 days.

(21) Appl. No.: 12/472,781

(22) Filed: May 27, 2009

(65) Prior Publication Data
US 2009/0302345 A1    Dec. 10, 2009

(30) Foreign Application Priority Data

Jun. 6, 2008  (TW) ................................ 97121207 A (51) Int. Cl.
*F21V 29/00*    (2006.01)
(52) U.S. Cl. .................. 257/723; 257/E21.499; 362/294
(58) Field of Classification Search .................... 257/88, 257/723, E21.499, E25.02; 313/46; 362/294
See application file for complete search history.

(56) References Cited

U.S. PATENT DOCUMENTS

| 7,196,354 | B1 * | 3/2007 | Erchak et al. | 257/79 |
| 2001/0030866 | A1 * | 10/2001 | Hochstein | 362/294 |
| 2005/0023551 | A1 * | 2/2005 | Mizuyoshi | 257/99 |
| 2005/0152146 | A1 * | 7/2005 | Owen et al. | 362/294 |
| 2006/0035511 | A1 * | 2/2006 | Mrakovich et al. | 439/404 |

* cited by examiner

*Primary Examiner* — Thomas L Dickey
(74) *Attorney, Agent, or Firm* — Muncy, Geissler, Olds , & Lowe, PLLC (57) ABSTRACT

An LED lamp module includes a heat sink element having one-piece form; a circuit substrate affixed onto the heat sink element, wherein the substrate has at least an opening exposing the heat sink element, and has an area smaller than that of the heat sink element; a plurality of LED chips mounted on the exposed portion of the heat sink element and electrically connected to the circuit substrate; and a light transparent package material, encapsulating the plurality of LED chips, wherein the heat sink element includes a uniform temperature plate or a plate including at least a vacuum cavity, and an extension part extending laterally from the plate and turned to surround the plurality of LED chips, forming a secondary optical structure. A fabrication method for the LED lamp module is also disclosed. Existing fabrication process is simplified and the cost is lowered with increased heat dissipation effect.

17 Claims, 8 Drawing Sheets

LED LAMP MODULE AND FABRICATION METHOD THEREOF

BACKGROUND OF THE INVENTION

1. Field of the Invention

The present invention relates to LED packaging technology, and more particularly to an LED lamp module and the fabrication method thereof.

2. Description of the Related Art

Light-emitting diodes (LED) are long-lasting, energy-saving and durable, and therefore, high brightness LED illumination devices are green energy environmental products and may be widely applied in the future. Generally speaking, a high brightness LED lamp is obtained by soldering a light emitting module, usually including a plurality of LED light bulbs, onto a circuit board or an aluminum substrate. In order to improve heat dissipation, an extra heat sink element is added to a design, such as affixing heat sink fins to the bottom of the substrate. However, aside from the heat dissipation problem of a high brightness LED illumination device, how to reduce cost and simplify the fabrication method to solve the high unit price problem is also very important.

SUMMARY OF THE INVENTION

The present invention is directed to providing an LED lamp module and the fabrication method thereof. An LED chip is mounted directly on a heat sink element which has one-piece form, and is electrically connected to a circuit layer or a substrate disposed on the heat sink element without an electrical connection between the heat sink element and the circuit layer or the substrate.

The present invention is directed to providing an LED lamp module and the fabrication method thereof, wherein the size of a heat sink element is larger than a circuit layer or a substrate thereon, thereby providing the LED lamp module excellent heat dissipation.

The present invention is directed to providing an LED lamp module and the fabrication method thereof. A circuit substrate with an opening is affixed onto a heat sink element, and an LED chip is mounted directly on the heat sink element at the opening, which provides excellent heat dissipation and simplifies the fabrication process.

One embodiment provides an LED lamp module including: a heat sink element having one-piece form and comprised of a metal; at least a substrate affixed onto the heat sink element, wherein the substrate comprises a circuit and has at least an opening exposing the heat sink element and the area of the substrate is smaller than that of the heat sink element; a plurality of LED chips mounted on the exposed portion of the heat sink element and electrically connected to the circuit of the substrate without an electrical connection between the heat sink element and the circuit; and a light transparent package material, encapsulating the plurality of LED chips, and a portion of the substrate, wherein the heat sink element comprises a plate, and an extension part extending laterally from the plate and turned to surround the plurality of LED chips, thereby forming a secondary optical structure, wherein the heat sink element comprises at least a vacuum cavity.

Another embodiment provides a fabrication method for an LED lamp module including: providing a heat sink element, wherein the heat sink element has one-piece form and is comprised of a metal; affixing at least a substrate onto the heat sink element, wherein the substrate comprises a circuit and at least an opening exposing the heat sink element and the area of the substrate is smaller than that of the heat sink element; mounting a plurality of LED chips on the exposed portion of the heat sink element in the pit; electrically connecting the LED chip and the circuit of the substrate without electrically connecting the heat sink element and the circuit; and providing a light transparent package material encapsulating the plurality of LED chips, and a portion of the substrate, wherein the heat sink element comprises a plate, and an extension part extending laterally from the plate and turned to surround the plurality of LED chips, thereby forming a secondary optical structure, wherein the heat sink element comprises at least a vacuum cavity.

BRIEF DESCRIPTION OF THE DRAWINGS

The objectives, technical contents and characteristics of the present invention can be more fully understood by reading the following detailed description of the preferred embodiments, with reference made to the accompanying drawings.

DETAILED DESCRIPTION OF THE INVENTION

Figure 1:
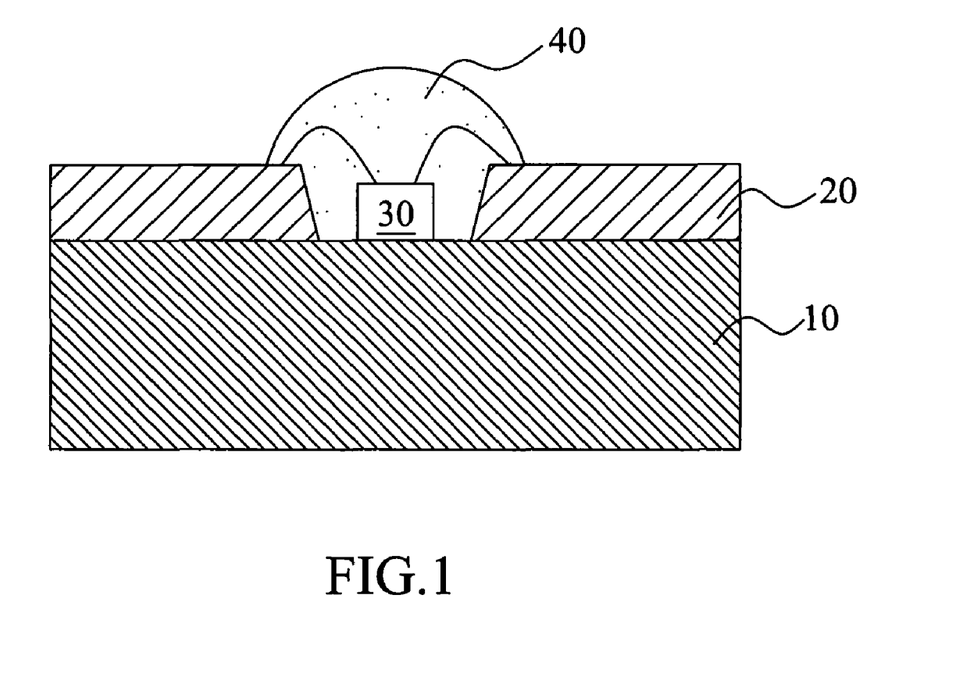
FIG. 1 and FIG. 2 are schematic diagrams illustrating different embodiments of the present invention.

Referring to FIG. 1, in this embodiment, an LED lamp module includes: a heat sink element 10, a substrate 20, an LED chip 30, and a light transparent package material 40 encapsulating the LED chip 30 and a portion of the substrate 20. The substrate 20 is affixed onto the heat sink element 10, and comprises a circuit (not illustrated in the figure), and has at least an opening (not illustrated in the figure) exposing the heat sink element 10. The area of the substrate 20 is smaller than that of the heat sink element 10, which is made of a metal or a thermally conductive material and thus maximizing the available heat dissipation area where area is limited.

Then, the LED chip 30 is mounted on the heat sink element 10, and electrically connected to the circuit on the substrate 20 via a plurality of metal wires (not illustrated in the figure). A light transparent package material 40 is employed to encapsulate the LED chip 30, metal wires and a portion of the substrate 20. When the LED lamp module is illuminating, the LED chip 30—the main heat source—generates enormous amount of heat. In the present embodiment, because the LED chip 30 is directly affixed to the heat sink element 10, and the heat sink element 10 has one-piece form, heat is directly dissipated all over the heat sink element 10. Additionally, since the area of the heat sink element 10 is larger than the size of the substrate 20 and the LED chip 30, the heat dissipation rate can be greatly increased.

In one embodiment, after the LED chip 30 is mounted, a fluorescent material (not illustrated in the figure) is coated over the LED chip 30 or mixed with the light transparent package material 40.

Figure 2:
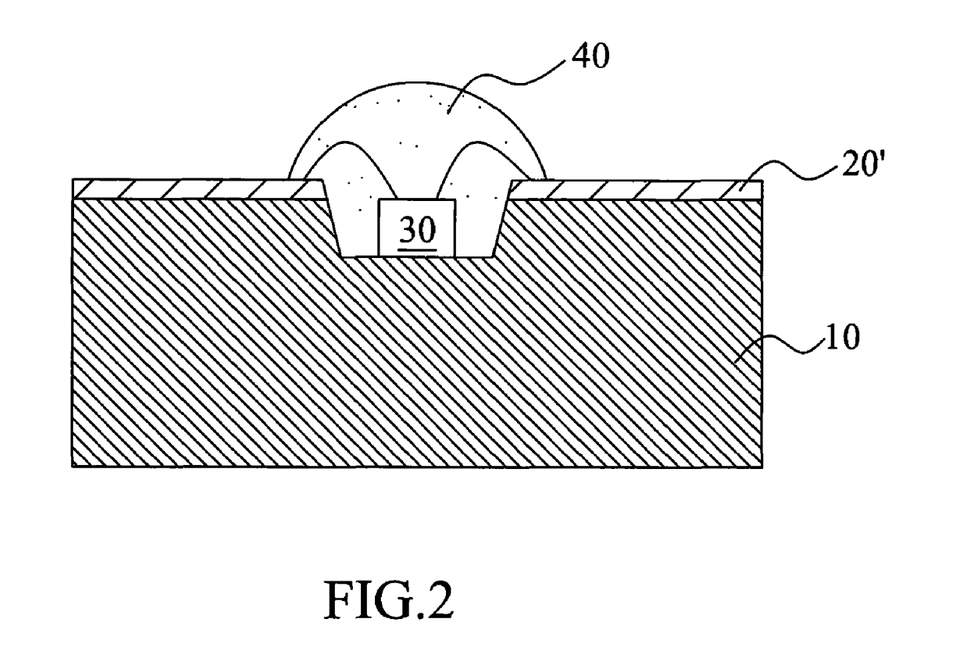

In another embodiment, as illustrated in FIG. 2, a heat sink element 10 having at least a pit thereon is used. A circuit layer 20' is disposed on the heat sink element 10 and surrounds the pit. An LED chip 30 is disposed in the pit of the heat sink element 10 and is electrically connected to the circuit layer 20' via metal wires. A light transparent package material 40 is used to fill the pit and encapsulate the LED chip 30, metal wires and a portion of the circuit layer 20'. In one embodiment, the circuit layer 20' can also be a substrate.

Figure 3A:
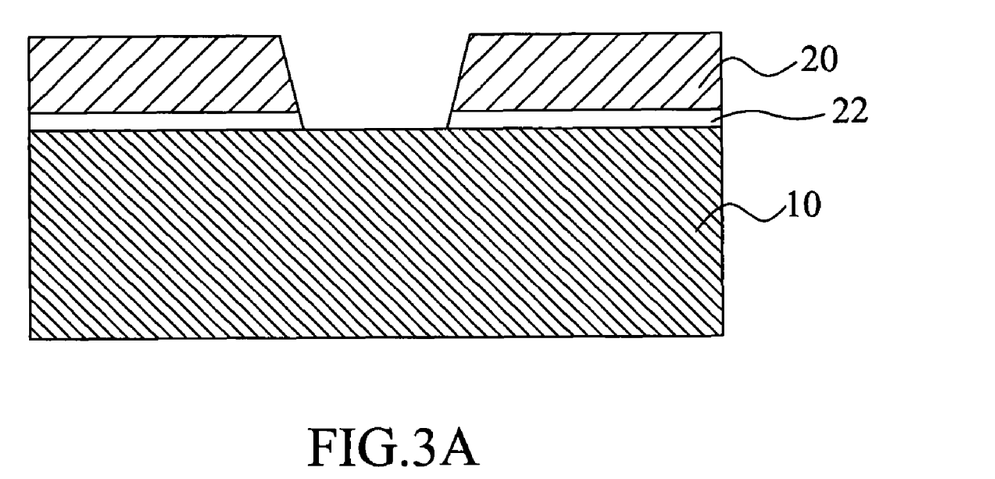
FIG. 3A, FIG. 3B, FIG. 3C and FIG. 3D are schematic diagrams illustrating the flow of one embodiment of the present invention.

FIG. 3A, FIG. 3B, FIG. 3C and FIG. 3D are schematic diagrams illustrating the flow of one embodiment. This embodiment discloses a fabrication method for an LED lamp module including the following steps. First, as illustrated in FIG. 3A, a heat sink element 10 is provided. Then, an adhesive layer 22 is utilized to affix a substrate 20 onto the heat sink element 10, wherein the adhesive layer 22 is comprised of a thermally conductive or an insulating material. The substrate 20 has at least an opening exposing the heat sink element 10. The substrate 20 can be a copper clad substrate, a substrate made of an insulating material, a glass fiber substrate, a ceramic substrate, a glass fiber pre-preg substrate or a substrate made of a polymeric material. In one embodiment, the substrate is a soft substrate made of a material such as polyimide.

Figure 3B:
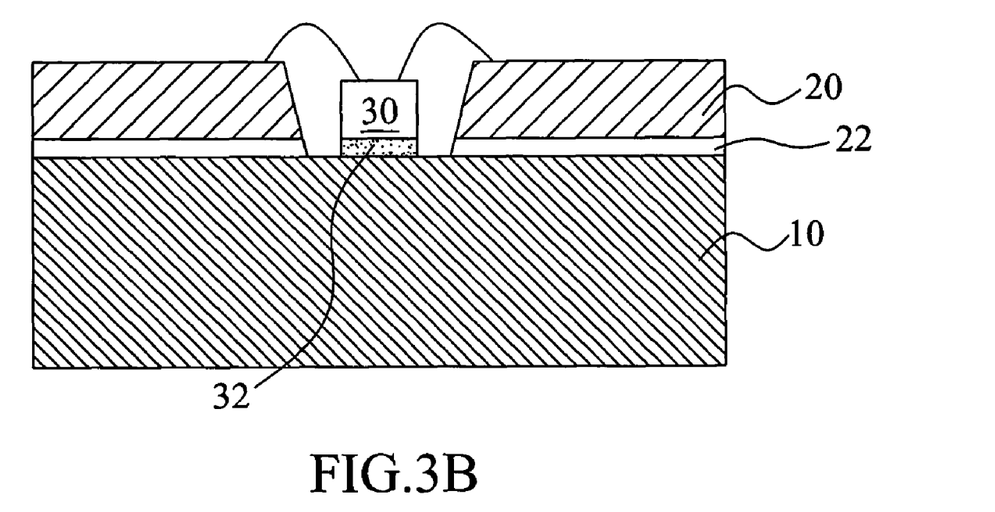
Figure 3C:
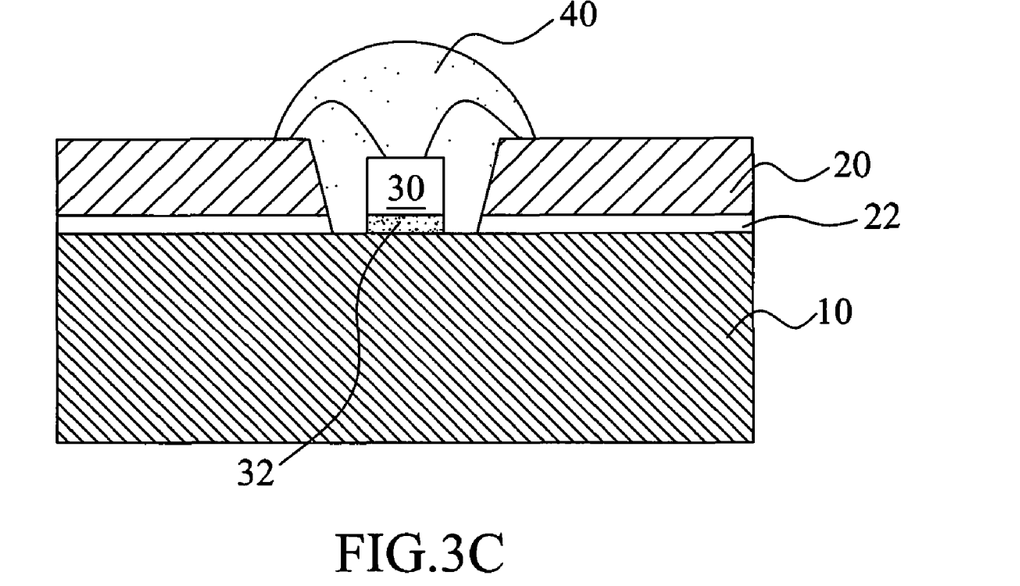

Next, referring to FIG. 3B, an adhesive material 32 is utilized to mount the LED chip 30 on the heat sink element 10, wherein the adhesive material 32 is electrically conductive and/or thermally conductive material, which may be comprised of a metal or non-metal material, or an insulating material. The LED chip 30 is electrically connected to a circuit (not illustrated in the figure) of the substrate 20 via a plurality of metal wires. Next, as illustrated in FIG. 3C, a light transparent material 40 is provided to fill the pit and encapsulate the LED chip 30, metal wires and a portion of the substrate 20.

Figure 3D:
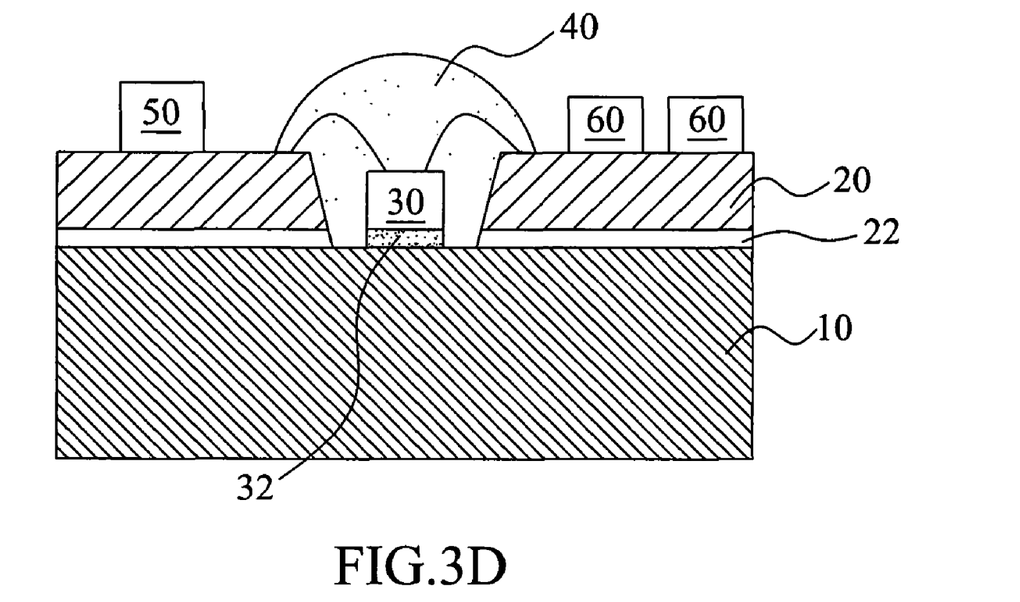

In continuation to the above description, in one embodiment, as illustrated in FIG. 3D, a control chip 50 and a passive element 60 are disposed over the substrate 20, and electrically connected to the circuit thereof. A lampshade or a shell is assembled with the LED lamp module to complete the LED light bulb end product. In one embodiment, the control chip 50 can also be disposed directly on the heat sink element 10, and electrically connected to the circuit on the substrate 29 via metal wires or other electrical connection structure. As an alternative, in one embodiment, the control circuit is integrated with the circuit in the substrate 20.

Figure 4A:
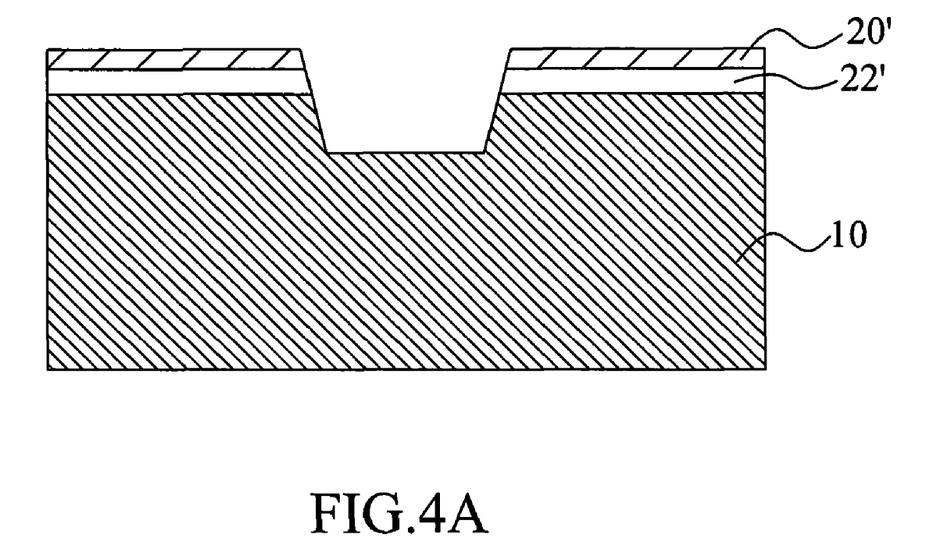
FIG. 4A and FIG. 4B are schematic diagrams illustrating the flow of one embodiment of the present invention.
Figure 4B:
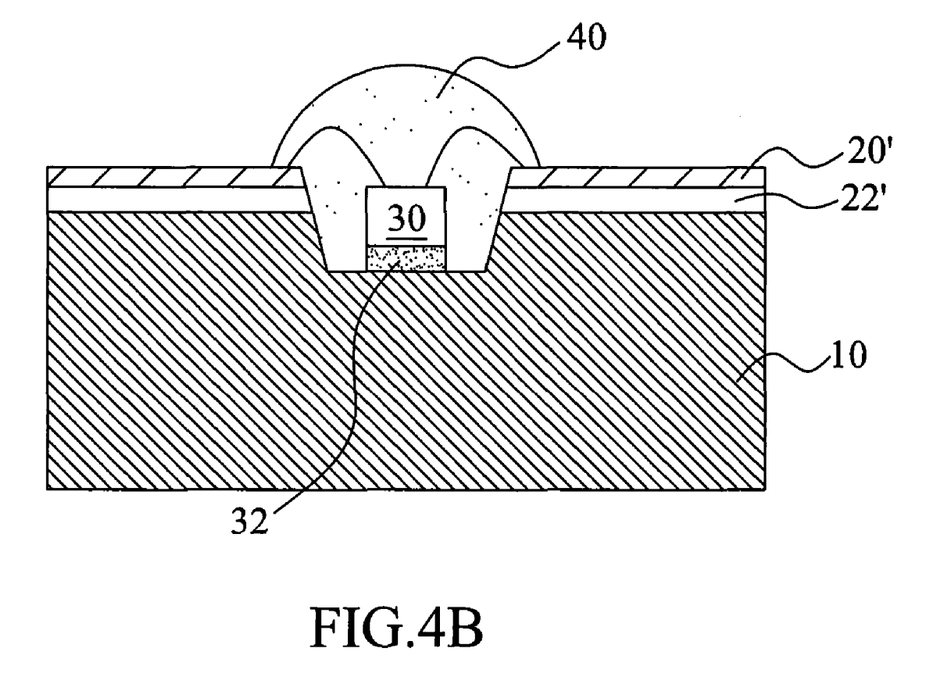

FIG. 4A and FIG. 4B are schematic diagrams illustrating the flow of one embodiment. In the present embodiment, a fabrication method for an LED lamp module including the following steps is proposed. First, as illustrated in FIG. 4A, a heat sink element 10 having at least a pit thereon is provided. Next, an adhesive layer 22' is formed for disposing the circuit layer 20' over the heat sink element 10 and surrounding the pit.

Next, referring to FIG. 4B, an LED chip 30 is disposed on the heat sink element 10 in the pit, and is electrically connected to the circuit layer 20' via a plurality of metal wires. An adhesive material 32 is employed to mount the LED chip 30 on the heat sink element 10 and the adhesive material 32 is a thermally conductive or an insulating material, which may be comprised of a metal or non-metal material. A fluorescent material (not illustrated in the figure) can be coated on the LED chip 30 for one embodiment. A light transparent material 40 is utilized to fill the pit and encapsulate the LED chip 30, metal wires and a portion of the circuit layer 20'. In one embodiment, the fluorescent material (not illustrated in the figure) can also be mixed with the light transparent package material 40.

Following the above description, in one embodiment, a control chip and a passive element are disposed over the circuit layer and are electrically connected to the circuit. Besides, in the aforementioned embodiment, an anode surface treatment procedure is conducted for the surface of the metal heat sink element, and thus a surface treated anode layer is formed, which improves heat dissipation or reflective effect.

Figure 5:
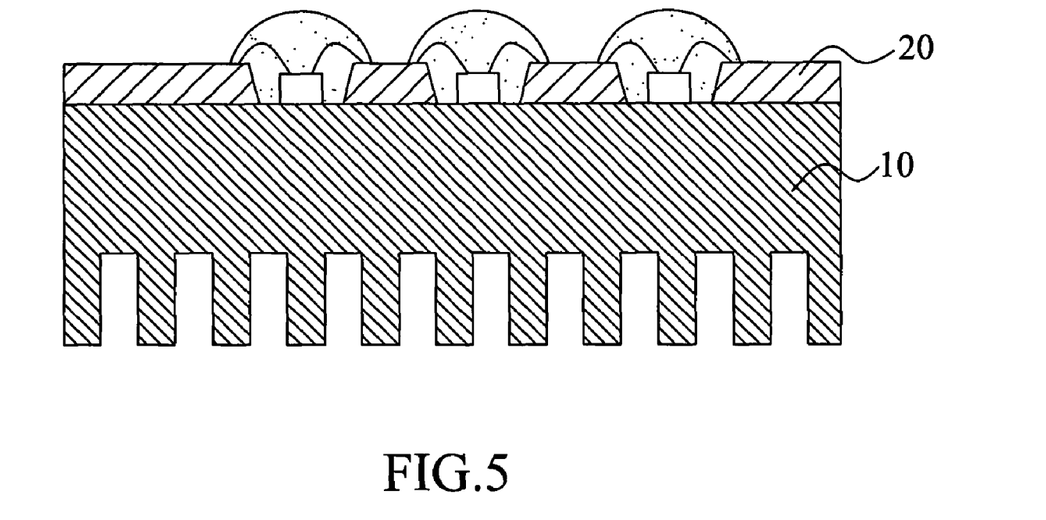
FIG. 5 is a schematic diagram illustrating one embodiment of the present invention.

Moreover, as illustrated in FIG. 5, in one embodiment, the number of LED chips is determined according to the design or functional needs, however it is not limited thereto. The shape and the number of sub-elements of a heat sink element 10 are also unrestricted. For example, a heat sink element 10 can be designed to comprise a plurality of fins or a plurality of fins along with heat conductive tubes.

Figure 6A:
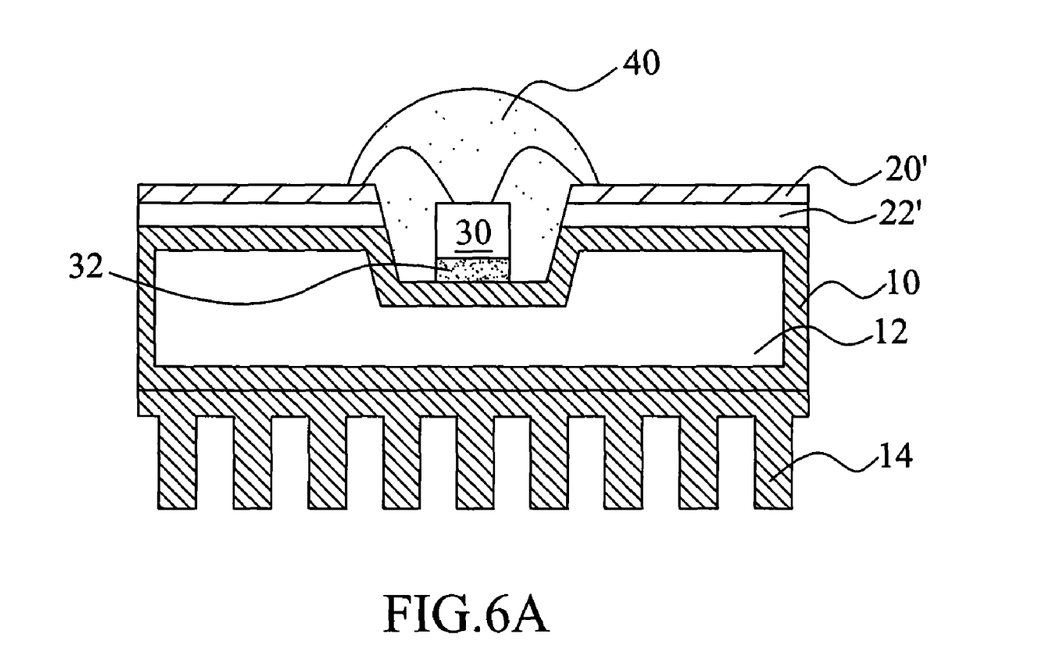
FIG. 6A, FIG. 6B, FIG. 6C, FIG. 6D and FIG. 6E are schematic diagrams illustrating different embodiments of the present invention.

Referring to FIG. 6A, in the present embodiment, a heat sink element 10, whether having a pit thereon or not, may be a uniform temperature plate, a heat conductive tube or a laminated heat conductive tube comprising at least a vacuum cavity 12. The uniform temperature plate is a vacuum cavity of a capillary micro structure on the inner wall. When heat is transferred from a heat source to an evaporation area, the highly thermally conductive liquid form media in the vacuum cavity 12 may quickly and evenly distribute the evaporation heat to a low temperature area to cool down, and then may flow back to the heat source through the capillary micro structure in the cavity. Such operation is repeated constantly in the cavity, which is the operating principle of a uniform temperature plate.

Figure 6B:
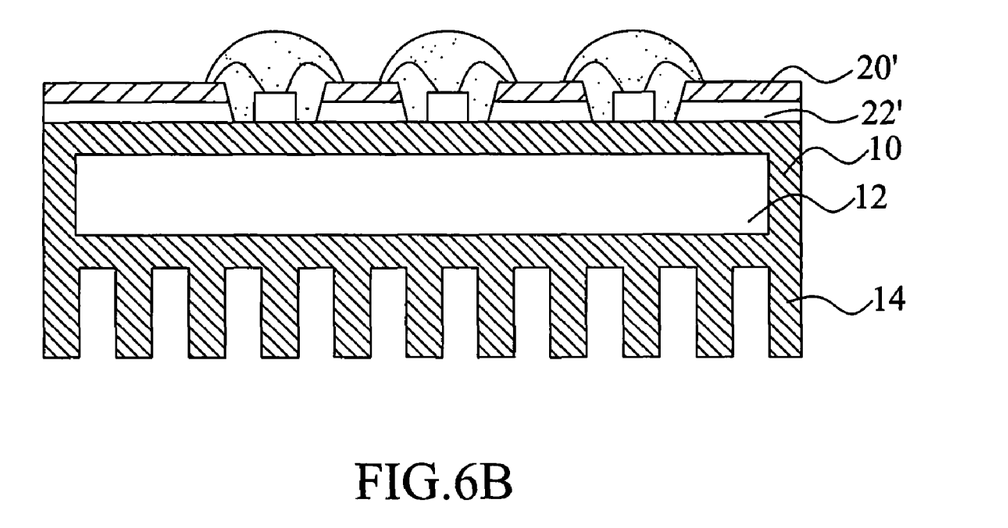

An LED chip 30 is disposed on the heat sink element 10 (the uniform temperature plate), and consequently, heat produced by the LED chip 30 may be quickly and evenly distributed to the whole heat sink element 10 from the heat source to achieve uniform temperature, which prevents heat accumulated at the heat source and causing excessively high temperature. Then heat can be dissipated out by an additional heat sink device, such as heat sink fins 14 contacting the heat sink element 10. In one embodiment, as illustrated in FIG. 6B, the heat sink fins 14 and the heat sink element 10 can also be of one body form. The uniform temperature plate can alternatively be a flat surface design without any pit. Since the difference between the heat dissipation area provided by the heat sink element 10 and the heat source is large, heat can be quickly transferred out from the heat source. Besides, as the area of the substrate 20 is smaller than that of the heat sink element 10, the heat sink element 10 can reserve enough area for heat dissipation. The size of the heat dissipation element 10 may be determined by the amount of heat generated by the lamp module or the heat dissipation rate (which is related to the size of the substrate 10 and the number of the LED chip(s) 30).

Figure 6C:
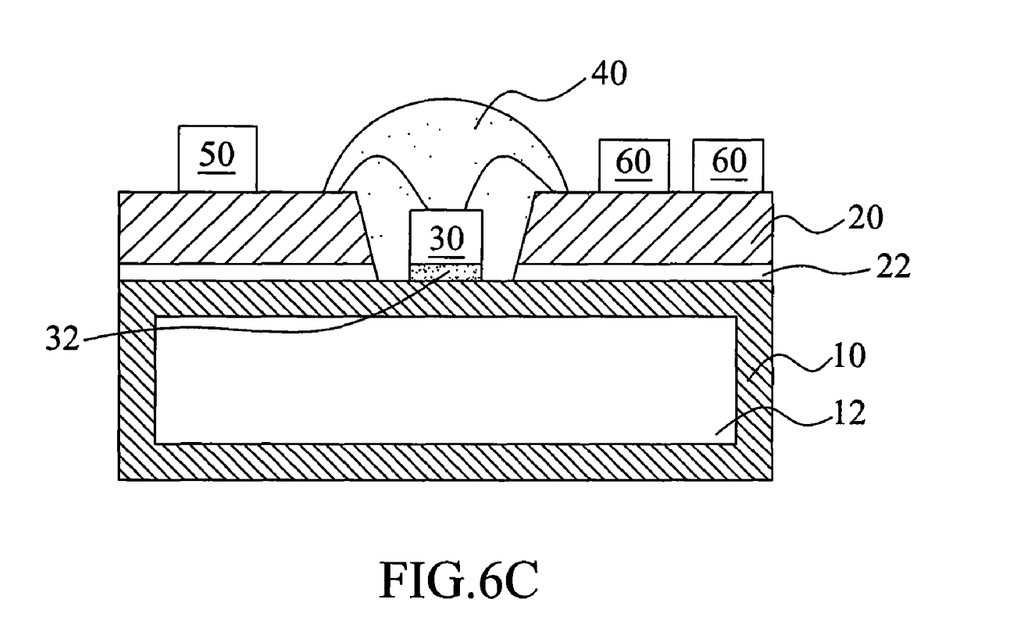

Referring to FIGS. 6B and 6C, in different embodiments, the surface of the heat sink element 10, a uniform temperature plate, utilizes the opening on the substrate 20 or the circuit layer 20' to form a pit structure, where the LED chip 30 is disposed in the pit and contacts the surface of the heat sink element 10, and therefore, the possibility of even heat dissipation may be effectively increased.

Figure 6D:
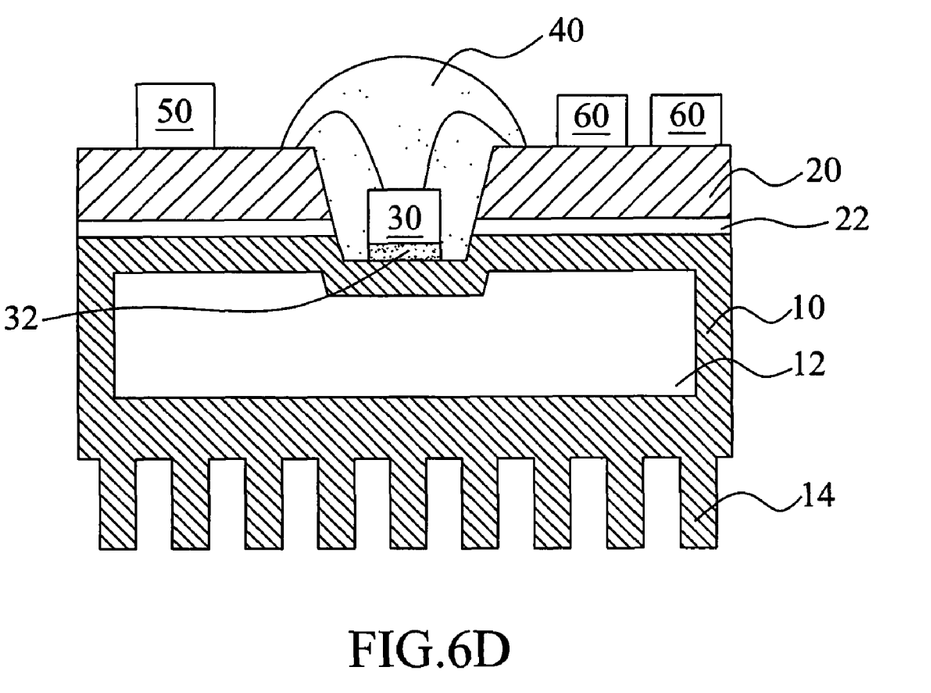
Figure 6E:
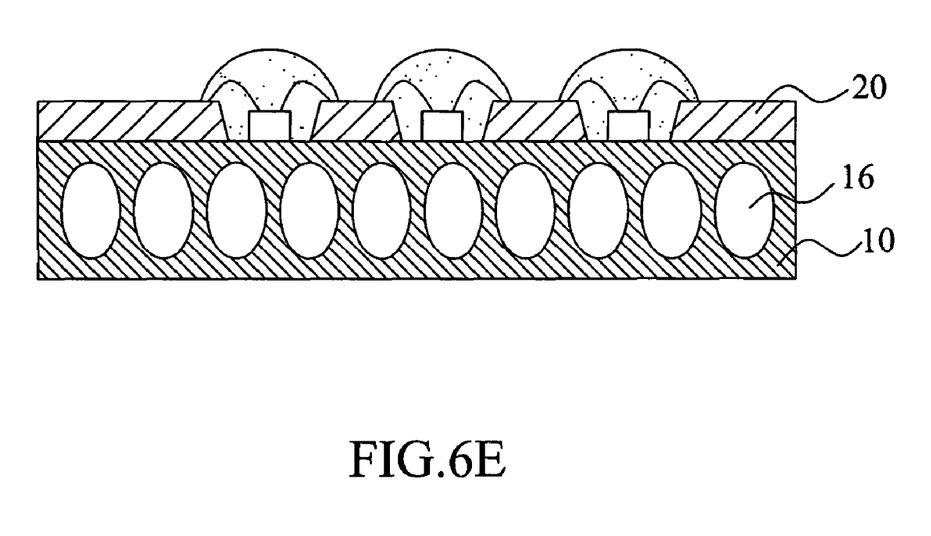

As illustrated in FIG. 6D, in one embodiment, the depth of the pit is established by a depressed part on the heat sink element 10 along with the opening of the substrate 20. Additionally, the heat sink element 10 can also comprise a plurality of tubular hollow cavities 16, as illustrated in FIG. 6E. The heat sink element 10 consists of a plurality of laminated hollow tubes with opened or closed tubular hollow cavities 16. In one embodiment, not illustrated in the figure, heat conductive tubes are disposed in the cavity to improve heat dissipation. In one embodiment, the heat sink element can also be a heat conductive tube comprising at least a vacuum cavity. Furthermore, in one embodiment, an air exhausting device is added according to different needs. For example a turbo air exhausting ventilator can be installed in addition at where the heat sink element is located to carry heat away quickly.

Figure 7A:
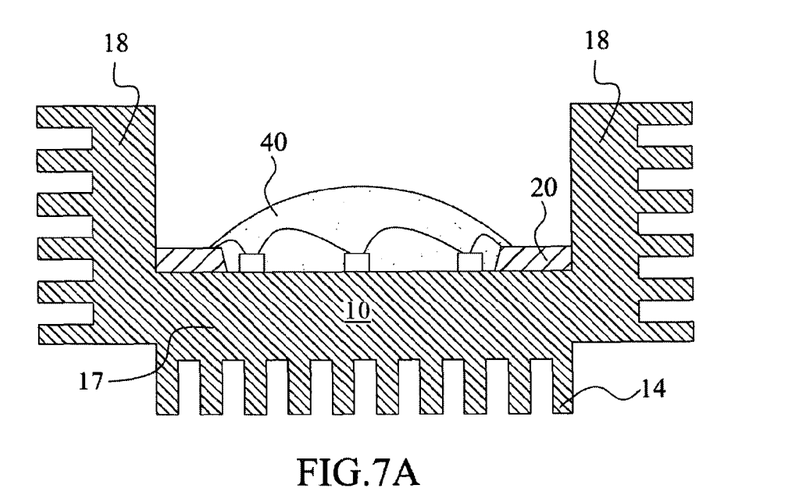
FIG. 7A and FIG. 7B are schematic diagrams illustrating different embodiments of the present invention.
Figure 7B:
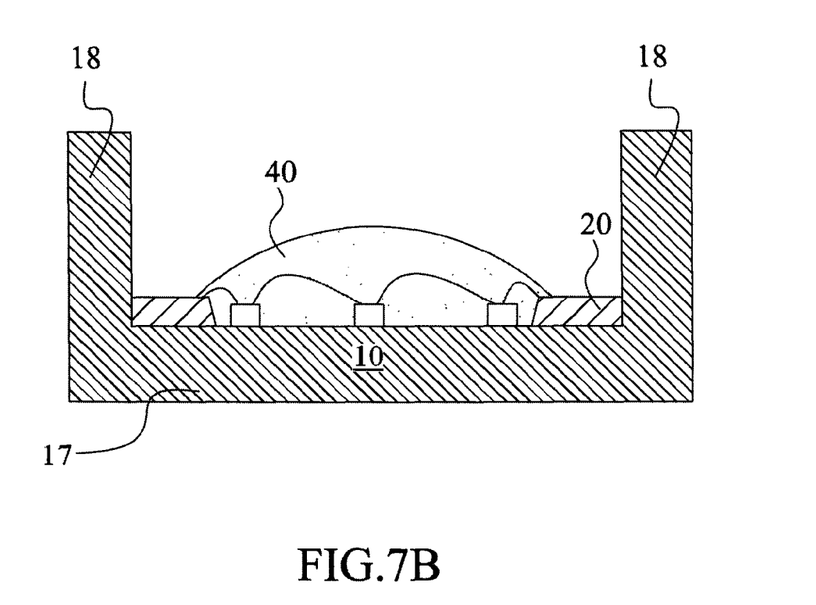

In one embodiment, as illustrated in FIG. 7A and FIG. 7B, the heat sink element 10 comprises a plate 17 and an extension part 18 extending laterally from the plate 17 and turned to surround a plurality of LED chips 30 mounted on the plate 17 thereby forming a secondary optical structure, and improving the luminous efficiency. The surface of the plate 17 and the extension part 18 near the light source can be treated to increase the reflectivity, e.g., mirror coating. As a result, the plate 17 and the extension part 18 of the heat sink element 10 form a reflective cup which is a secondary optical structure. In this embodiment, because of the design concept of the heat sink element 10 being larger than the substrate 20, the heat sink element 10 provides substrate, heat sink and reflective cup functionalities simultaneously and thereby effectively simplifying the existing fabrication process and lowering the cost.

In one embodiment, the heat sink element is a bendable thin plate. As illustrated in FIG. 7B, the extension part 18 of the heat sink element 10 can be formed by a bent heat sink element 10 after the LED lamp module assembly is completed. Owing to such characteristic, besides the designated area for mounting the LED chip or other related components over the heat sink element 10, the remaining area can be bent into various forms as needed.

According to the aforementioned description, an LED chip is disposed in an opening or a pit, and such opening or pit is formed by an opening of the substrate and a heat sink element or is provided by the heat sink element. Either a single or a plurality of LEDs can be disposed in the opening or the pit. Moreover, in order to increase the luminous efficiency of LEDs, a reflection layer can be coated over the pit. If the opening or the pit is not deep enough, an annular block wall can be formed on the substrate or the circuit layer surrounding the opening or the pit to enhance the opening or the pit structure. The substrate or the circuit layer of the present invention are not limited to be single-layered, they can be multi-layered forming a normal pit or a stair-stepping pit.

In summary, for the present invention, an LED chip is directly mounted on a heat sink element, and electrically connected to a circuit layer over or a circuit of a substrate, wherein the size of the heat sink element is larger than that of the circuit layer or substrate thereon, and therefore, providing the LED lamp module excellent heat dissipation. A die packaged LED lamp module can be used directly, which simplifies the existing fabrication process, for there is no need to solder the LED lamp module to a circuit board or install additional heat sink elements. The number of the LEDs and their arrangement can be adjusted based on different luminous product specifications, and the fabrication of the product is completed with an outer shade and its assembly components. The simplified fabrication process can lower the cost so that the high unit price of LED lamps may be reduced and becomes more acceptable to the market.

The embodiments described above are to demonstrate the technical contents and characteristics of the preset invention to enable the persons skilled in the art to understand, make, and use the present invention. However, it is not intended to limit the scope of the present invention. Therefore, any equivalent modification or variation according to the spirit of the present invention is to be also included within the scope of the present invention.

What is claimed is:

1. An LED lamp module comprising:
   a heat sink element having one-piece form and comprised of metal;
   at least a substrate, affixed onto said heat sink element, wherein said substrate comprises a circuit and has at least an opening exposing said heat sink element and the area of said substrate is smaller than that of said heat sink element;
   a plurality of LED chips, mounted on the exposed portion of said heat sink element and electrically connected to said circuit of said substrate without an electrical connection between said heat sink element and said circuit; and
   a light transparent package material, encapsulating said plurality of LED chips, and a portion of said substrate, wherein said heat sink element comprises a plate, and an extension part extending laterally from said plate and turned to surround said plurality of LED chips, thereby forming a secondary optical structure,
   wherein the heat sink element comprises at least a vacuum cavity.

2. The LED lamp module according to claim 1, wherein said heat sink element is a uniform temperature plate.

3. The LED lamp module according to claim 2, wherein said heat sink element further comprises heat dissipation fins disposed on a surface of said heat sink element.

4. The LED lamp module according to claim 2, wherein said heat sink element further comprises liquid in said vacuum cavity.

5. The LED lamp module according to claim 2, wherein said heat sink element further comprises a capillary structure disposed on an inner surface of said vacuum cavity.

6. The LED lamp module according to claim 1, wherein said heat sink element further comprises heat sink fins disposed on a surface of said heat sink element.

7. The LED lamp module according to claim 1, wherein said heat sink element is a bendable thin plate and said extension part is turned by bending.

8. A fabrication method for an LED lamp module comprising:
   providing a heat sink element, wherein said heat sink element has one-piece form and is comprised of metal;
   affixing at least a substrate onto said heat sink element, wherein said substrate comprises a circuit and has at least an opening exposing said heat sink element and the area of said substrate is smaller than that of said heat sink element;
   mounting a plurality of LED chips on the exposed portion of said heat sink element;
   electrically connecting said plurality of LED chips with said circuit of said substrate without electrically connecting said heat sink element and said circuit; and
   providing a light transparent material for encapsulating said LED chip; and a portion of said substrate, wherein said heat sink element comprises a plate, and an extension part extending laterally from said thin plate and turned to surround said plurality of LED chips, thereby forming a secondary optical structure,
   wherein the heat sink element comprises at least a vacuum cavity.

9. The fabrication method for an LED lamp module according to claim 8 further comprising disposing a control chip over said substrate and electrically connecting said control chip to said circuit.

10. The fabrication method for an LED lamp module according to claim 8 further comprising disposing a passive element over said substrate and electrically connecting said passive element to said circuit.

11. The fabrication method for an LED lamp module according to claim 8 further comprising coating a fluorescent material over said plurality of LED chips or mixing said fluorescent material into said light transparent package material.

12. The fabrication method for an LED lamp module according to claim 8 further comprising disposing an air exhausting device on said heat sink element.

13. The fabrication method for an LED lamp module according to claim 8, wherein said heat sink element further comprises heat dissipation fins disposed on a surface of said heat sink element.

14. The fabrication method for an LED lamp module according to claim 8, wherein said heat sink element further comprises liquid in said vacuum cavity.

15. The fabrication method for an LED lamp module according to claim 8, wherein said heat sink element further comprises a capillary structure disposed on an inner surface of said vacuum cavity.

16. The fabrication method for an LED lamp module according to claim 8, wherein said heat sink element further comprises heat sink fins disposed on a surface of a heat sink element.

17. The fabrication method for an LED lamp module according to claim 8, wherein said heat sink element is a bendable thin plate, and said extension part is turned by bending.

* * * * *